(12) United States Patent
Nguyen et al.

(10) Patent No.: US 7,781,277 B2
(45) Date of Patent: Aug. 24, 2010

(54) SELECTIVE UNIAXIAL STRESS RELAXATION BY LAYOUT OPTIMIZATION IN STRAINED SILICON ON INSULATOR INTEGRATED CIRCUIT

(75) Inventors: Bich-Yen Nguyen, Austin, TX (US); Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 618 days.

(21) Appl. No.: 11/383,113

(22) Filed: May 12, 2006

(65) Prior Publication Data
US 2007/0262385 A1    Nov. 15, 2007

(51) Int. Cl.
*H01L 21/8238* (2006.01)
(52) U.S. Cl. .............. 438/199; 438/141; 257/E21.633; 257/634
(58) Field of Classification Search ............... 438/660, 438/663, 199, 301, 300; 257/194, 288, 401, 257/351, E21.001, E21.632, E21.696
See application file for complete search history.

(56) References Cited

U.S. PATENT DOCUMENTS

| | | | |
|---|---|---|---|
| 6,815,770 B1 | 11/2004 | Chien et al. | |
| 6,831,292 B2 | 12/2004 | Currie et al. | |
| 6,881,632 B2 | 4/2005 | Ffitzgerald et al. | |
| 2005/0035369 A1* | 2/2005 | Lin et al. | 257/194 |
| 2005/0116360 A1* | 6/2005 | Huang et al. | 257/900 |
| 2005/0139872 A1 | 6/2005 | Chidambaram et al. | |
| 2006/0043500 A1 | 3/2006 | Chen et al. | |
| 2006/0102955 A1* | 5/2006 | Chen et al. | 257/349 |
| 2006/0292783 A1* | 12/2006 | Lee et al. | 438/199 |

FOREIGN PATENT DOCUMENTS

| | | |
|---|---|---|
| CN | 1499634 A | 5/2004 |
| CN | 1627519 A | 6/2005 |
| CN | 1645625 A | 7/2005 |

OTHER PUBLICATIONS

Irisawa et al., High Current Drive Uniaxially-Strained SGOI pMOSFETs Fabricated by Lateral Strain Relaxation Technique, 2005 Symposium on VLSI Technology Digest of Technical Papers, pp. 178-179.
International Search Report and Written Opinion of PCT/US07/66436, Applicant's file reference SC14747TP, dated Feb. 27, 2008.

\* cited by examiner

*Primary Examiner*—Alexander G Ghyka
*Assistant Examiner*—Abdulfattah Mustapha

(57) ABSTRACT

An integrated circuit includes NMOS and PMOS transistors. The NMOS has a strained channel having first and second stress values along first and second axes respectively. The PMOS has a strained channel having third and fourth stress values along the first and second axes. The first value stress differs from the third value and the second value differs from the fourth value. The NMOS and PMOS have a common length (L) and effective width (W), but differ in length of diffusion (SA) and/or width of source/drain (WS). The NMOS WS may exceed the PMOS WS. The NMOS may include multiple dielectric structures in the active layer underlying the gate. The SA of the PMOS may be less than the SA of the NMOS. The integrated circuit may include a tensile stressor of silicon nitride over the NMOS and a compressive stressor of silicon nitride over the PMOS.

18 Claims, 3 Drawing Sheets

SELECTIVE UNIAXIAL STRESS RELAXATION BY LAYOUT OPTIMIZATION IN STRAINED SILICON ON INSULATOR INTEGRATED CIRCUIT

FIELD OF THE INVENTION

The invention is in the field of semiconductor fabrication and integrated circuits and, more specifically, fabrication processes and integrated circuits that employ strained silicon.

RELATED ART

In the field of integrated circuits, strained silicon refers generally to the practice of intentionally stressing the channels of NMOS and/or PMOS transistors to improve carrier mobility. Biaxially-strained substrates including, but no limited to, Strained-Si on SiGe, Strained-SiGe on Insulator, and Strained-Si directly on Insulator, provide high level of strain directly in the channel of the devices fabricated on these substrates. This is in contrast to typical process-induced stressors which introduce strain remotely through the addition of stressed materials adjacent or in close proximity to the channel in order to induce a strained channel. However, simultaneously improving the carrier mobility for both types of devices is difficult with a uniformly-strained substrate because PMOS carrier mobility and NMOS carrier mobility are optimized under different types of strain. Moreover, strain conditions that optimize carrier mobility may negatively impact other device characteristics such as threshold voltage, thereby complicating the selection of strain conditions. It would be desirable to implement a fabrication process and design for devices fabricated on biaxially-strained substrate in which NMOS and PMOS carrier mobility is simultaneously optimized without negatively affecting other device characteristics.

BRIEF DESCRIPTION OF THE DRAWINGS

The present invention is illustrated by way of example and not limited by the accompanying figures, in which like references indicate similar elements, and in which.

Figure 1:
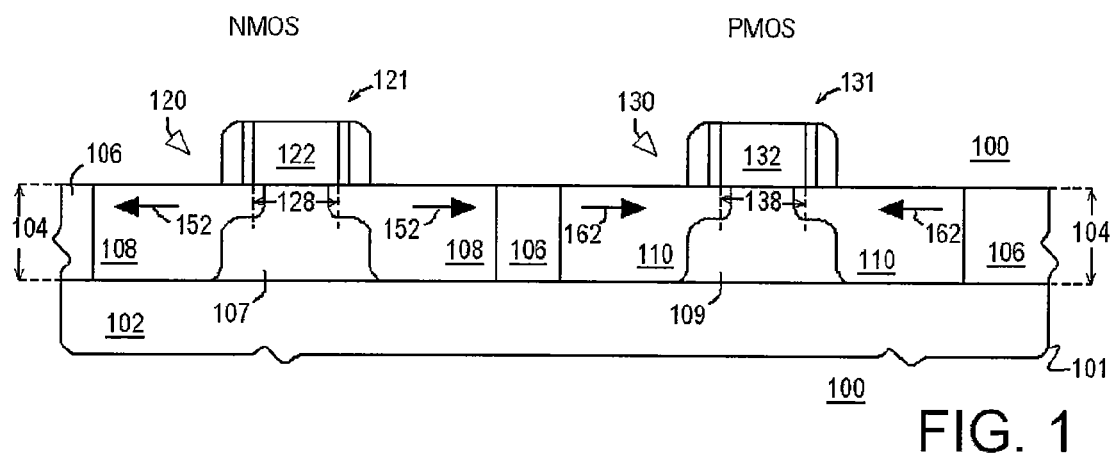
FIG. 1 is a partial cross sectional view of an integrated circuit emphasizing symmetry between NMOS and PMOS devices of like ratio (W/L)

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, an integrated circuit includes an NMOS transistor and a PMOS transistor in which stress elements have been selectively and uniaxially controlled to increase carrier mobility in both transistors without substantially degrading other performance parameters. The stress control is achieved through modification of transistor layout and the nature of the substrate strain locally to minimize the stress effects along a desired direction relative to the transistor channel. For example, stress along a first axis that is perpendicular to the transistor channel may be reduced or otherwise modified for a one type of transistor (i.e., either NMOS or PMOS) while stress along a second axis that is parallel to the transistor may be reduced or otherwise modified along for the other type of transistor. Throughout this disclosure, the axis that is collinear with the direction of current flow under normal biasing, i.e., the axis that is perpendicular to the transistor gate electrode, is referred to as the channel axis. The axis that is perpendicular to the channel axis and is referred to herein as the "width" axis because stress along this axis is affected by the width of the transistor.

In one embodiment, the NMOS transistor layout is modified to include a "discontinuous" channel in which "islands" of isolation structures under the transistor gate create a plurality of parallel transistor channels. Instead of a single, continuous transistor channel having a width (W), the NMOS transistor includes N parallel transistors channels having widths $W_1$ through $W_N$ where the sum of $W_1$ through $W_N$ is substantially equal to W. In one embodiment, the PMOS transistor is characterized by reduced-area source and drain diffusion regions, which are achieved by reducing the "length of source diffusion" parameter (identified as SA herein) and the "length of drain diffusion" parameter (DA). For the sake of simplicity, the SA and DA of a transistor are assumed to be equal throughout this disclosure and are identified by the single parameter SA and referred to as "length of diffusion" although other embodiments may include transistors having unequal SA and SD parameters.

Employing multiple parallel "narrow channel" NMOS transistors reduces stress along the width axis, changing the uniform biaxial stress to predominantly uniaxial stress along the channel axis, thereby reducing the NMOS $V_T$ shift associated with biaxial tensile stress. The reduction in width axis stress only nominally reduces the NMOS carrier mobility because NMOS carrier mobility is less a function of width axis stress than channel axis stress. The NMOS carrier mobility reduction resulting from the loss of width axis stress can be compensated by the addition of an uniaxial tensile stressor like a tensile capping layer selectively formed over the NMOS devices that further enhances the channel axis stress. Moreover, the use of reduced SA PMOS devices reduces the undesirable channel axis tensile stress in PMOS devices. When combined with a compressive stressor such as a compressive capping layer selectively formed over PMOS devices, the PMOS channel axis stress may become compressive, which desirably enhances the PMOS carrier mobility. By incorporating both techniques, an integrated circuit fabrication process may modify the stress in a biaxially tensile strained silicon SOI starting material to achieve optimized mobility for NMOS and PMOS transistors without degrading NMOS VT or other performance parameters.

Figure 7:
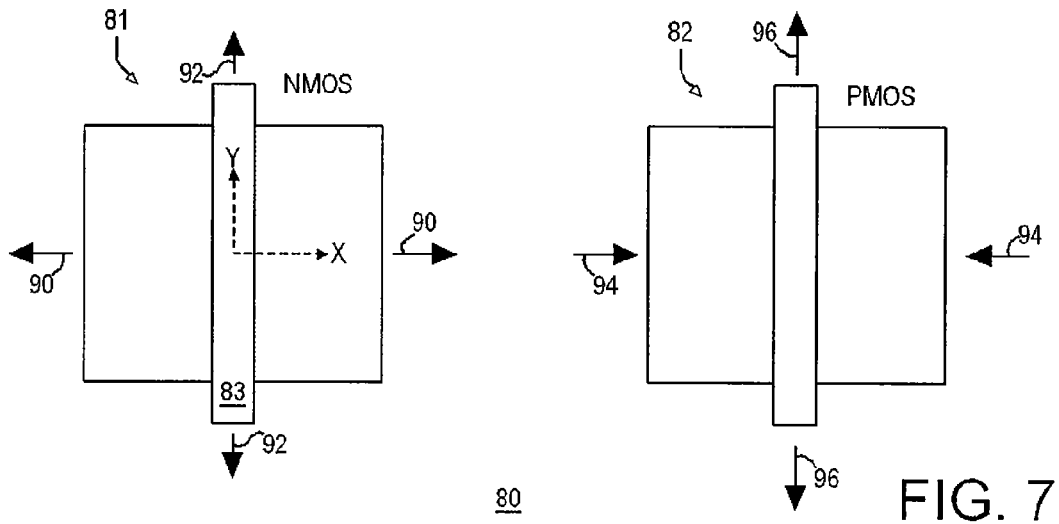
FIG. 7 depicts complementary stress configurations suitable for optimizing carrier mobility in NMOS and PMOS devices.

Referring initially to FIG. 7, a top view of a small portion of a partially completed, strained-silicon integrated circuit 80 is shown to illustrate idealized stress components for best NMOS and PMOS performance. Integrated circuit 80 includes an NMOS transistor 81 and a PMOS transistor 82. Optimized carrier mobility is achieved when the channel of NMOS transistor 81 is under tensile stress along the channel axis (the X axis in FIG. 7) that is perpendicular to transistor gate electrode 83. This stress element is represented in FIG. 7 by stress vectors 90. Similarly, carrier mobility is maximized when the channel of NMOS transistor 81 is under moderate tensile stress along the width axis (the Y axis in FIG. 7) that is collinear with transistor gate electrode 83. This stress element is represented in FIG. 7 by stress vectors 92. Moderate tensile stress along the width axis, represented by the magnitude or length of stress vector 92 relative to stress vectors 90, is preferable to enhance mobility while minimizing threshold voltage shifts for NMOS devices. Optimized carrier mobility for PMOS transistor 82, on the other hand, is achieved when the channel of PMOS transistor 82 is under compressive stress (stress vectors 94) along the channel axis and tensile stress (stress vectors 96) along the width axis.

Figure 6:
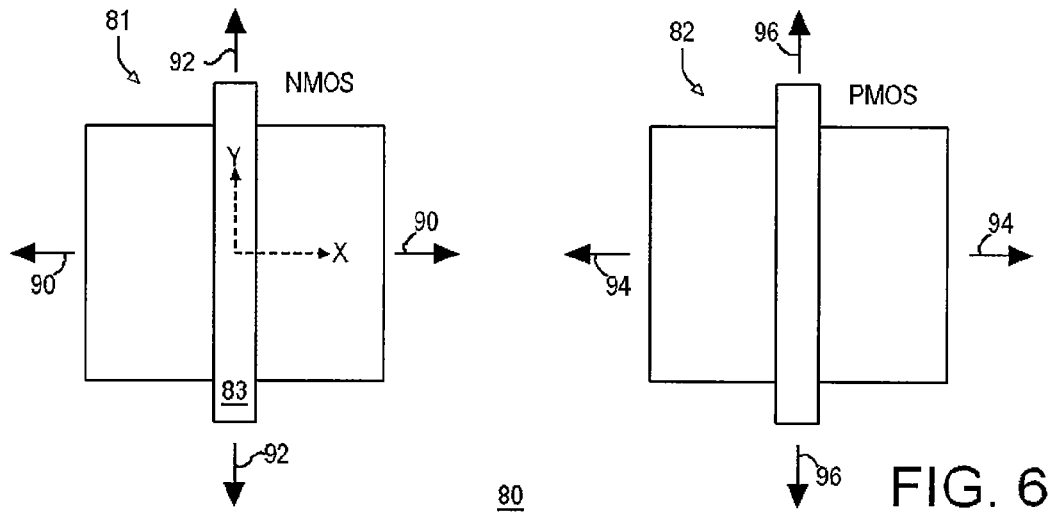
FIG. 6 depicts the inherent stress configurations of NMOS and PMOS devices fabricated on a biaxial-tensile strained substrate.

Unfortunately, as depicted in FIG. 6, conventional strained silicon starting materials may exhibit substantial tensile stress along the channel axis and the width axis for both types of transistors. In processes that use such starting material, this "inherent" stress is sub-optimal for at least two reasons. First, the biaxial stress of NMOS transistor 81 as depicted by tensile stressor vectors 90 and 92 in FIG. 6 produces an undesirable shift in NMOS threshold voltage (VT). Second, carrier mobility in PMOS devices is degraded by undesired tensile stress, represented by tensile stress vectors 94 in FIG. 6, along the channel axis. In conventional processing, the stress induced shift in NMOS VT is offset by increased channel doping. Increased channel doping, however, reduces carrier mobility, thereby at least partially negating the reason for which the transistor was strained.

Figure 2:
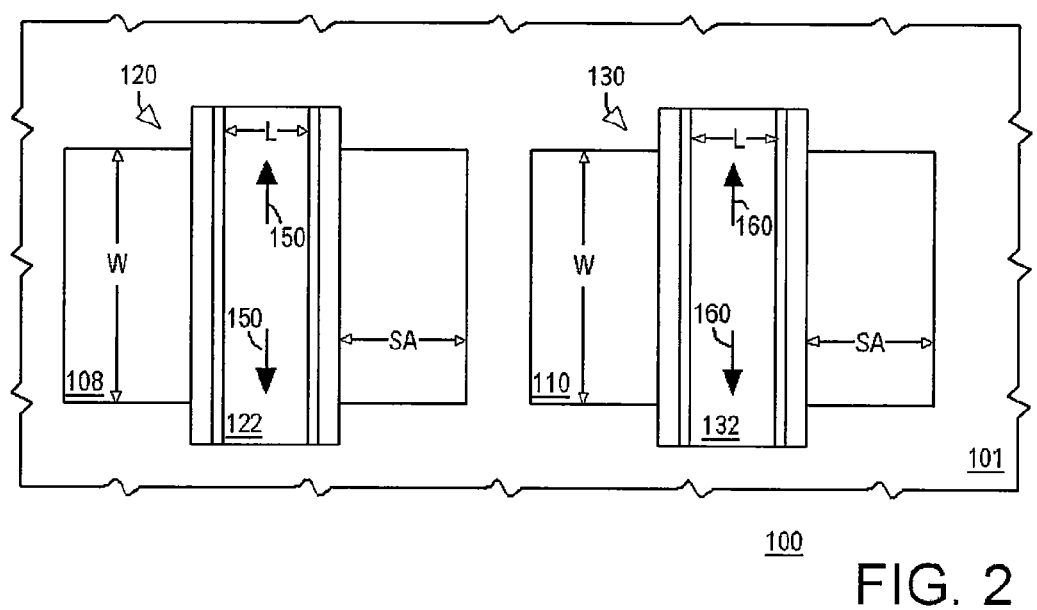
FIG. 2 is a top view of the integrated circuit of FIG. 1.

Referring now to FIG. 1 and FIG. 2, a cross sectional view and top view respectively of a portion of an integrated circuit 100 is described to facilitate comparisons with an integrated circuit 300 featuring uniaxial stress reduction layout as depicted and described with respect to FIG. 3 and FIG. 4 below. Integrated circuit 100 includes an NMOS transistor 120 and a PMOS transistor 130 fabricated in a semiconductor wafer 101. Semiconductor wafer 101 as depicted includes a buried oxide (BOX) layer 102 underlying an active layer 104. This type of wafer commonly referred to as a semiconductor on insulator (SOI) wafer. Those skilled in semiconductor fabrication process will recognize that the SOI embodiment of semiconductor wafer 101 may include a bulk portion (not depicted in FIG. 2), likely made of silicon or another semiconductor, that underlies BOX layer 102.

Active layer 104 of SOI wafer 101 as depicted in FIG. 2 includes isolation structures 106, an NMOS active region that includes n-type source/drain regions 108 and p-type channel 107, and a PMOS active region that includes p-type source/drain regions 110 and n-type channel 109. The boundaries of source/drain regions 108 and channel 107 are determined by the location of gate structure 121, which overlies channel 107. More specifically, sidewalls of a conductive gate electrode 122 define the boundaries of NMOS transistor channel 128 extending between source/drain regions 108. Similarly, boundaries of source/drain regions 110 and channel 109 of PMOS transistor 130 are determined by the location of gate structure 131, which overlies channel 109. Sidewalls of a conductive gate electrode 132 define the boundaries of a PMOS transistor channel 138 extending between source/drain regions 110. Those familiar with semiconductor fabrication processing will appreciate that source/drain regions 108 and 110 may include lightly doped extension regions and heavily doped source/drain areas that are not explicitly differentiated in this disclosure.

The top view of FIG. 2 reveals that the physical dimensions and layout of transistors 120 and 130 are substantially identical. In integrated circuit 100 as depicted in FIG. 2, an NMOS transistor and a PMOS transistor that have the same L and the same W/L ratio have the same layout. Thus, transistors 120 and 130 have the same drawn L, the same drawn W, and the same overall drawn area including the same value of SA (length of diffusion). In one embodiment, transistors 120 and 130 are minimum dimension transistors in which the channel length dimension L has the smallest value of any transistor in the integrated circuit. The value of L in this embodiment is also likely to be the smallest value that is manufacturable using the available processing technology such as the smallest value that is definable by the photolithography/resist processing.

The layout symmetry of integrated circuit 100 is not optimized for performance in strained SOI processes. As indicated previously, for example, a strained SOI process in which the inherent stress is biaxially tensile for NMOS and PMOS transistors is characterized by an undesirably high NMOS threshold voltage and an undesirably low PMOS carrier mobility. One aspect of this disclosure includes modifying the layout of the integrated circuit of FIG. 1 and FIG. 2 to achieve optimized performance parameters.

Figure 3:
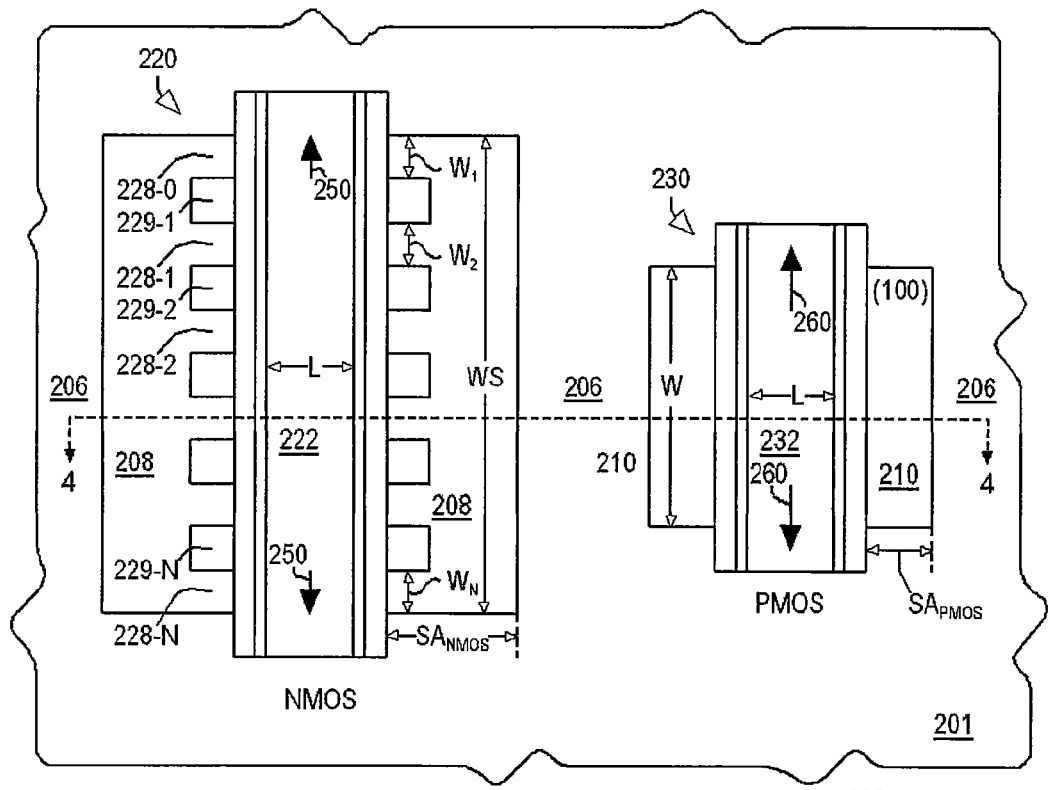
FIG. 3 is a top view of an integrated circuit emphasizing asymmetry between PMOS and NMOS devices of like ratio.
Figure 4:
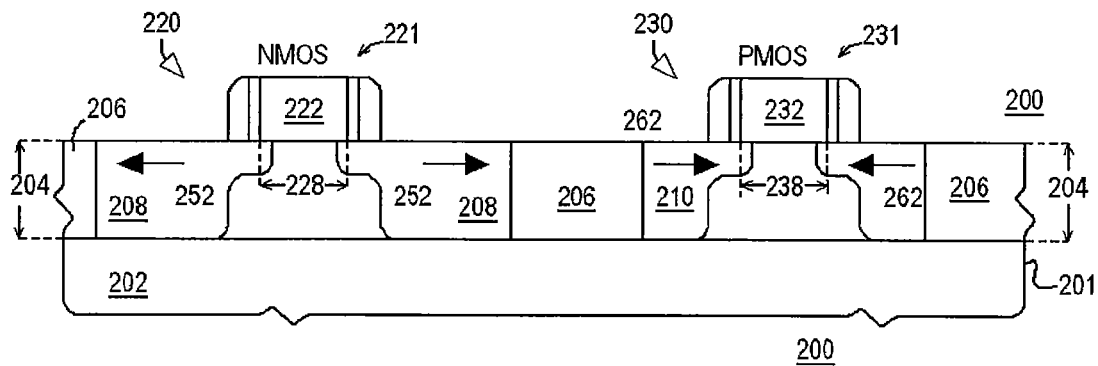
FIG. 4 is a partial cross sectional view of the integrated circuit of FIG. 3.

Referring now to FIG. 3 and FIG. 4, a top view and a cross section view respectively of an integrated circuit 200 including an optimized layout for NMOS transistor 220 and PMOS transistor 230 to achieve desirably high NMOS and PMOS carrier mobility are depicted. FIG. 4 is a cross section taken along the cross section line 4-4 of FIG. 3. The portions of integrated circuit 200 depicted in FIG. 3 and FIG. 4 emphasize the use of differently dimensioned and differently laid out NMOS and PMOS transistors of "like size." More specifically, NMOS transistor 220 and PMOS transistor 230 as depicted in FIG. 3 and FIG. 4 are of like size because they both have substantially the same value of L and substantially the same value of effective W. The effective W represents the portion of the transistor width that is available to participate in current conduction. In the depicted embodiment, transistors 220 and 230 do not occupy the same area of semiconductor substrate 201.

NMOS transistor 220 as depicted is laid out to include a set of parallel and relatively narrow transistor channels 228-0 through 228-N underlying and controlled by a single gate electrode 222. Channel dielectric structures 229-1 through 229-N are located underlying gate electrode 222 between adjacent channels. Thus, for example, channel dielectric structure 229-1 is positioned between transistor channels 228-0 and 228-1, channel dielectric structure 229-2 is positioned between transistor channels 228-1 and 228-2, and so forth. Using channel dielectric structures 229 to define the transistor channel with a plurality or set of narrow transistor channels beneficially reduces the channel axis stress in NMOS transistor 220.

The effective electrical width W of transistor 220 is determined by the sum of the widths $W_0$, $W_1$, etc. of the corresponding transistors channels 228-0, 228-1, etc. In other words, $W = W_1 + W_2 + \ldots + W_N$. Thus, a width of source/drain parameter (WS) of NMOS transistor 220 is greater than the effective electrical width W of transistor 220.

In one embodiment, W of NMOS transistor 220 is substantially equal to the W of like-sized PMOS transistor 230. The use of a set of relatively narrow and parallel transistor channels beneficially reduces the width axis stress in NMOS transistor 220 as illustrated by the magnitude of the width-axis stress vectors 250 depicted in FIG. 3 relative to the width arrow stress vectors 260 of PMOS transistor 230 and relative to the width arrow stress vector 150 of transistor 120 in FIG. 2. The reduced width axis stress resulting from laying out the channel of transistor 220 as a set of parallel, narrow channels, reduces the threshold voltage shift associated with the biaxial tensile stress of transistor 120 in FIG. 2 while only marginally reducing the NMOS carrier mobility.

PMOS transistor 230 as depicted in FIG. 3 and FIG. 4 features a length of diffusion value $SA_{PMOS}$ that is less than the length of diffusion value $SA_{NMOS}$ of transistor 220 and less than the length of diffusion value SA of PMOS transistor 130 in FIG. 2. The use of a reduced SA value for PMOS transistor 230 reduces the channel axis stress in PMOS transistor 230 thereby beneficially improving the PMOS carrier mobility. As depicted in FIG. 4, the channel axis stress vectors 262 of PMOS transistor 230 actually indicate compressive stress. Uniaxial compressive channel axis stress in PMOS transistor 230 is achieved in one embodiment by reducing the length of diffusion value $SA_{PMOS}$ and, in addition, using a compressive stressor selectively in the PMOS regions. One example of such a stressor is described below with respect to FIG. 5.

Figure 5:
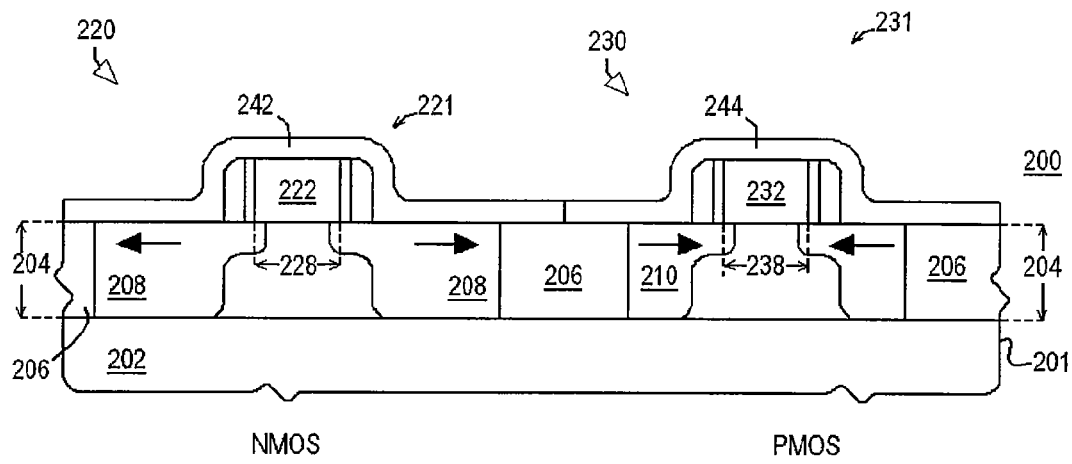
FIG. 5 depicts processing subsequent to FIG. 4 according to one embodiment of the invention.

Turning now to FIG. 5, a first stressor 242 is selectively formed overlying NMOS transistor 220 and a second stressor 244 is selectively formed overlying PMOS transistor 230. First stressor 242 preferably exerts tensile stress on transistor channel 228 of NMOS transistor 220 thereby enhancing the carrier mobility of NMOS transistor 220. Similarly, second stressor 244 preferably exerts compressive stress on transistor channel 238 of PMOS transistor 230 thereby enhancing the carrier mobility of PMOS transistor 230. In one embodiment, first stressor 242 is a dielectric material such as silicon nitride having a density and composition that inherently exerts tensile stress to source/drain regions 208 of NMOS transistor 220. In this embodiment, second stressor 244 is preferably a dielectric material such as silicon nitride having a composition and density that inherently exhibits compressive stress to source/drain regions 210 and transistor channel 238. Silicon nitride is a suitable material for first and second stressors 242 and 244 because silicon nitride can exhibit compressive or tensile stress properties in contact with source/drain regions 208 and 210 depending upon the composition of the silicon nitride. In one implementation, source/drain regions 208 and 210 are silicon regions and first and second stressors 242 and 244 are silicon nitride films where second stressor 244 has a higher concentration of nitrogen than first stressor 242.

Thus, integrated circuit 200 as depicted in FIG. 3 and FIG. 4 and FIG. 5 includes a first transistor of a first conductivity type (NMOS transistor 220) that includes a first, biaxially strained transistor channel 238. NMOS transistor 220 is characterized by a first value of stress indicated by stress vectors 250 along a width axis and a second value of stress (vectors 252) along a channel axis. Integrated circuit 200 as depicted in FIG. 3 and FIG. 4 further includes second transistor of a second conductivity type (PMOS transistor 230). PMOS transistor 230 includes a second biaxially strained transistor channel 238 characterized by a third value of stress (vectors 260) along the width axis and a fourth value (vectors 262) of stress along the channel axis. Due to the selective, uniaxial stress engineering described herein, the magnitude or value of first stress vectors 250 differs from the magnitude or value of stress vectors 260 and the value of stress vectors 252 differs from the value of stress vectors 262.

In the depicted SOI embodiment, transistor channels 228 and 238 are a portion of an active layer 204 that overlies a buried oxide (BOX) layer 202. The transistor channels 228 and 238 and the source/drain regions 208 and 210 are silicon in one embodiment. In other embodiments, source/drain regions 208 and/or 210 are implemented with a semiconductor such as SiGe or SiC having a lattice constant that differs from the lattice constant of silicon to provide a stressor adjacent to the corresponding transistor channel.

Integrated circuit 220 (as depicted in FIG. 5) further includes a first stressor 242 overlying NMOS transistor 220 and a second stressor 244 overlying PMOS transistor 230. First stressor 242 exerts tensile stress on first strained transistor channel 228 while second stressor 244 exerts compressive stress on second strained transistor channel 238. First stress 242 may be a silicon nitride film with a relatively low concentration of nitrogen while stress 244 may be a silicon nitride film with a relatively high concentration of nitrogen.

In the depicted embodiment, the selective, uniaxial stress control is achieved at least in part by layout considerations. Specifically NMOS transistor 220 and the PMOS transistor 230 as depicted in FIG. 3 and FIG. 4 have a common length (L) value and a common value of effective electrical width (W). NMOS transistor 220 and PMOS transistor 230 differ, however, their length of diffusion (SA) values, their width of source/drain (WS) values, or both. NMOS transistor 220, for example, may have a WS that is greater than a WS value of PMOS transistor 230. In this embodiment, NMOS transistor 220 may include a plurality of channel dielectric structures underlying a transistor gate electrode. These channel dielectric structures preferably define a set of parallel and relatively narrow transistor channel. Moreover, FIG. 3 depicts the SA of PMOS transistor 230 ($SA_{PMOS}$) is less than an SA value ($SA_{NMOS}$) of the NMOS transistor.

In the foregoing specification, the invention has been described with reference to specific embodiments. However, one of ordinary skill in the art appreciates that various modifications and changes can be made without departing from the scope of the present invention as set forth in the claims below. For example, although the illustrated embodiment of active layer 204 employs a silicon transistor channel and silicon source/drain regions, other embodiments may use alternative semiconductor materials and especially stress inducing semiconductor materials including silicon germanium and silicon carbon. Similarly, although the depicted implementation illustrates source/drain regions 208 and 210 that are coplanar with transistor channel 228 and 238, other embodiments may employ elevated source/drain regions or recessed source/drains. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An integrated circuit, comprising:
    a first transistor of a first conductivity type, including a first strained transistor channel, wherein the first transistor is characterized by a first value of stress along a first axis and a second value of stress along a second axis that is perpendicular to the first axis;
a first stressor overlying the first transistor;
a second transistor of a second conductivity type, including a second strained transistor channel, wherein the second strained transistor channel is characterized by a third value of stress along the first axis and a fourth value of stress along the second axis;
wherein the first, second, and fourth values are tensile stress values and the third value is a compressive stress value; and
a second stressor overlying the second transistor, wherein a source/drain region displaced on either side of the first strained transistor channel is comprised of a semiconductor having a lattice constant that differs from the lattice constant of silicon and the second stressor is different than the first stressor.

2. The integrated circuit of claim 1, wherein magnitudes of the first and fourth values exceed a magnitude of the second value.

3. The integrated circuit of claim 1, wherein a source/drain region displaced on either side of the first strained transistor channel is comprised of a semiconductor having a lattice constant that differs from the lattice constant of silicon.

4. The integrated circuit of claim 1, wherein the first transistor is an NMOS transistor and the second transistor is a PMOS transistor.

5. The integrated circuit of claim 4, wherein the first stressor exerts tensile stress on the first strained transistor channel and wherein the second stressor exerts compressive stress on second strained transistor channel.

6. The integrated circuit of claim 4, wherein the NMOS transistor and the PMOS transistor have a common length (L) value and a common value of effective width (W), and further wherein the NMOS and PMOS transistor differ in a value of a parameter selected from the list consisting of length of diffusion region (SA) and width of source/drain (WS).

7. The integrated circuit of claim 6, wherein the NMOS transistor has a value of WS that is greater than a WS value of the PMOS transistor and wherein the NMOS transistor includes a plurality of channel dielectric structures underlying a transistor gate electrode.

8. The integrated circuit of claim 6, wherein the PMOS transistor has an SA value that is less than an SA value of the NMOS transistor.

9. The integrated circuit of claim 6 wherein the PMOS transistor has an SA value that is less than an SA value of the NMOS transistor.

10. An integrated circuit, comprising:
a first transistor of a first conductivity type having a first strained transistor channel underlying a first gate electrode;
a first stressor overlying the first transistor;
a second transistor of a second conductivity type having a second strained transistor channel underlying a second gate electrode, wherein a length (L) of the first transistor is substantially equal to an L of the second transistor and further wherein an effective width (W) of the first transistor is substantially equal to an effective width of the second transistor; and
a second stressor overlying the second transistor; wherein the first and second transistors differ in values of at least one parameter selected from the group consisting of length of diffusion (SA) and width of source/drain (WS), wherein the first stressor is different than the second stressor.

11. The integrated circuit of claim 10, wherein the first transistor has a value of WS that is greater than a WS value of the second transistor and wherein the first transistor includes a plurality of channel dielectric structures underlying a transistor gate electrode.

12. The integrated circuit of claim 10, wherein the second transistor has an SA value that is less than an SA value of the first transistor.

13. The integrated circuit of claim 10, wherein the second transistor has an SA value that is less than an SA value of the first transistor.

14. A semiconductor fabrication method, comprising:
forming a first transistor of a first conductivity type, including a first strained transistor channel, wherein the first transistor is characterized by a first value of stress along a channel axis of the first transistor and a second value of stress along a width axis of the first transistor, wherein the channel axis is perpendicular to the width axis and the first transistor is an NMOS transistor;
forming a second transistor of a second conductivity type, including a second strained transistor channel, wherein the second strained transistor channel is characterized by a third value of stress along a channel axis of the second transistor and a fourth value of stress along a width axis of the second transistor and the second transistor is a PMOS transistor; wherein the first, second, and third values of stress comprise first, second, and third tensile stress values and the fourth value of stress comprise a compressive stress value; and
forming a first stressor overlying the NMOS transistor and a second stressor overlying the PMOS transistor, wherein the first stressor exerts tensile stress on the first strained transistor channel and wherein the second stressor exerts compressive stress on second strained transistor channel and the first stressor is different than the second stressor.

15. The semiconductor fabrication method of claim 14, wherein magnitudes of the first and fourth values exceed a magnitude of the second value.

16. The semiconductor fabrication method of claim 14, including forming silicon source/drain regions displaced on either side of the first and second strained transistor channels.

17. The semiconductor fabrication method of claim 14, including forming a source/drain region, displaced on either side of the first strained transistor channel, comprised of a semiconductor having a lattice constant that differs from the lattice constant of silicon.

18. The semiconductor fabrication method of claim 14, wherein the NMOS transistor and the PMOS transistor have a common length (L) value and a common value of effective width (W), and further wherein the NMOS and PMOS transistor differ in a value of a parameter selected from the list consisting of length of diffusion region (SA) and width of source/drain (WS).

* * * * *